United States Patent
Hongo (10) Patent No.: US 10,139,170 B2
(45) Date of Patent: Nov. 27, 2018

(54) HEAT DISSIPATION STRUCTURE AND DEVICE

(71) Applicant: Kabushiki Kaisha Toshiba, Minato-ku (JP)

(72) Inventor: Takuya Hongo, Yokohama (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 255 days.

(21) Appl. No.: 15/070,452

(22) Filed: Mar. 15, 2016

(65) Prior Publication Data

US 2016/0282057 A1    Sep. 29, 2016

(30) Foreign Application Priority Data

Mar. 27, 2015   (JP) ................... 2015-066463

(51) Int. Cl.

| F28D 20/02 | (2006.01) |
| F28F 3/02 | (2006.01) |
| H01L 23/36 | (2006.01) |
| H01L 23/427 | (2006.01) |
| H01L 21/48 | (2006.01) |
| F28D 20/00 | (2006.01) |

(Continued)

(52) U.S. Cl.
CPC ............. *F28D 20/02* (2013.01); *F28F 3/02* (2013.01); *H01L 21/4882* (2013.01); *H01L 23/36* (2013.01); *H01L 23/4275* (2013.01); *F28D 2020/006* (2013.01); *F28D 2020/0008* (2013.01); *F28D 2020/0013* (2013.01); *F28D 2021/0029* (2013.01); *H01L 23/467* (2013.01); *Y02E 60/145* (2013.01)

(58) Field of Classification Search
CPC ............. F28D 20/02; F28D 2020/0008; F28D 2021/0029; F28D 2020/006; F28D 2020/0013; F28F 3/02; H01L 21/4882; H01L 23/467; Y02E 60/145
USPC ................................................. 165/10, 80.3
See application file for complete search history.

(56) References Cited

U.S. PATENT DOCUMENTS

| 6,212,074 B1 * | 4/2001 | Gonsalves ......... H01L 23/4006 165/185 |
| 2005/0007740 A1 * | 1/2005 | Neuschuetz ....... H01L 23/4275 361/704 |
| 2014/0305142 A1 * | 10/2014 | Aman ..................... F24J 1/00 62/4 |

FOREIGN PATENT DOCUMENTS

| JP | 2010-98004 | 4/2010 |
| JP | 2010098004 A * | 4/2010 |

(Continued)

OTHER PUBLICATIONS

Seiich Kubokawa, et al., "Development of New Heat Supply Unit Using Latent Heat (Prediction of the High Capacity Heat Exchanger Characteristic with PCM)", The Japan Society of Mechanical Engineers, 2005, 8 pgs. (with English Abstract).

*Primary Examiner* — Frantz Jules
*Assistant Examiner* — Lionel Nouketcha
(74) *Attorney, Agent, or Firm* — Oblon, McClelland, Maier & Neustadt, L.L.P.

(57) ABSTRACT

According to one embodiment, a heat dissipation structure includes a heat dissipating unit and a heat accumulating unit. The heat dissipating unit includes at least one extending part which extends in a first direction, and is configured to be thermally connected to an apparatus which is configured to produce heat. The heat accumulating unit includes an accommodating unit which is configured to be thermally connected to the extending part, a heat storage material sealed inside the accommodating unit.

14 Claims, 10 Drawing Sheets

(51) Int. Cl.
　　　*F28D 21/00*　　　(2006.01)
　　　*H01L 23/467*　　　(2006.01)

(56)　　　　References Cited

FOREIGN PATENT DOCUMENTS

JP　　　　2015-56562　　　3/2015
WO　　　WO 8600219 A　*　1/1986

* cited by examiner

HEAT DISSIPATION STRUCTURE AND DEVICE

CROSS-REFERENCE TO RELATED APPLICATIONS

This application is based upon and claims the benefit of priority from Japanese Patent Application No. 2015-066463, filed on Mar. 27, 2015; the entire contents of which are incorporated herein by reference.

FIELD

Embodiments described herein relate generally to a heat dissipation structure and a device.

BACKGROUND

A semiconductor device, such as a power device, or some other apparatus may produce heat while in operation. Hence, for example, a heat dissipation structure is used to cool the device. Examples of a known heat dissipation structure include a heat dissipation fin, which makes use of the natural convection of air, and a fan, which makes use of the forced convection of air.

If a heat dissipation structure is increased in size, it becomes possible to cool a device to a greater extent. However, because of an increase in the size of the heat dissipation structure, the size of the entire device also increases.

DETAILED DESCRIPTION

According to one embodiment, a heat dissipation structure includes a heat dissipating unit and a heat accumulating unit. The heat dissipating unit includes at least one extending part which extends in a first direction, and is configured to be thermally connected to an apparatus which is configured to produce heat. The heat accumulating unit includes an accommodating unit which is configured to be thermally connected to the extending part, a heat storage material sealed inside the accommodating unit.

A first embodiment is explained below with reference to FIGS. 1 to 9. Regarding the constituent elements according to the embodiments and in the explanation of those constituent elements, a plurality of expressions may be used. Moreover, regarding the constituent elements and the explanation thereof, the use of expressions not written herein is not inhibited. Furthermore, regarding the constituent elements and the explanation of those constituent elements not having a plurality of expressions, the use of other expressions is not inhibited.

Figure 1:
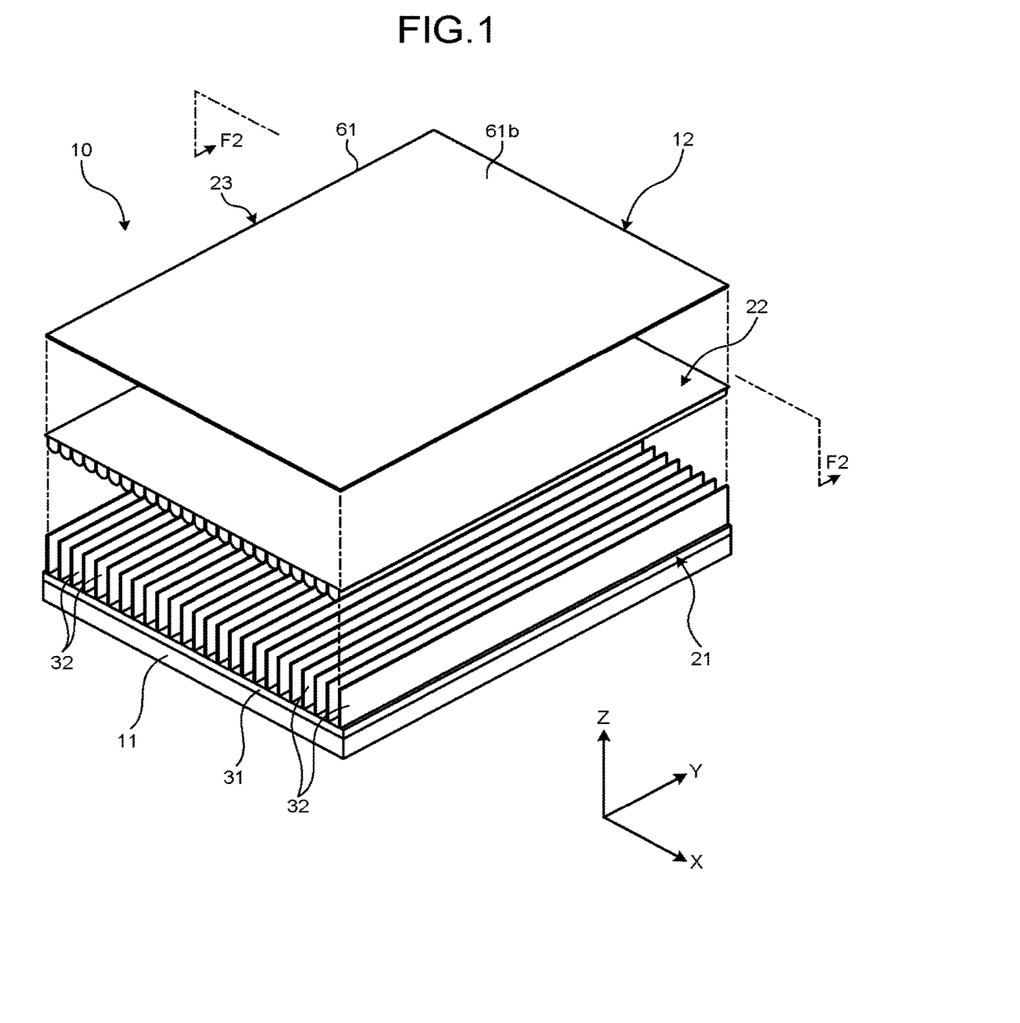
FIG. 1 is an exploded perspective view of a device according to a first embodiment.
Figure 2:
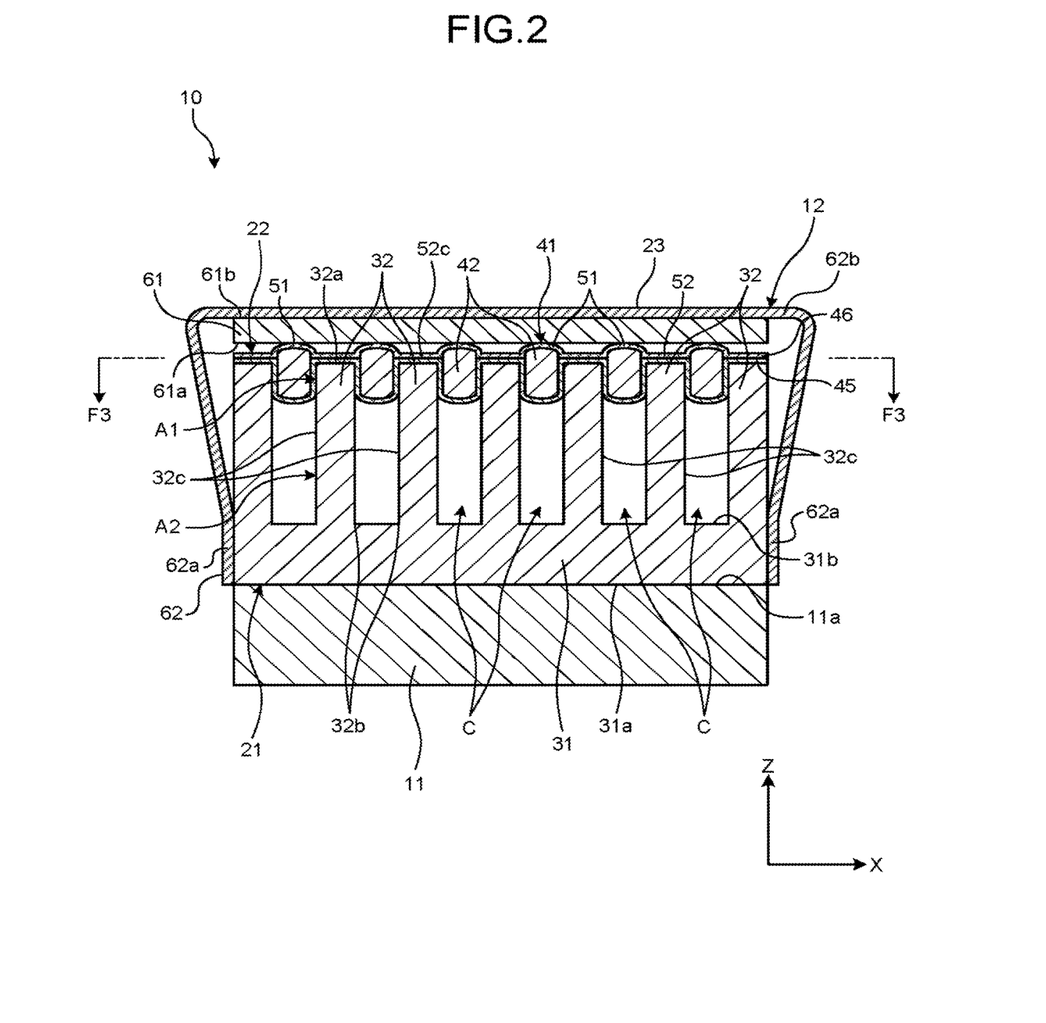
FIG. 2 is a cross-sectional view that schematically illustrates the device according to the first embodiment along F2-F2 line illustrated in FIG. 1.

FIG. 1 is an exploded perspective view of a device 10 according to a first embodiment. FIG. 2 is a cross-sectional view that schematically illustrates the device IC according to the first embodiment along F2-F2 line illustrated in FIG. 1. The device 10 includes an apparatus 11 and a heat dissipation structure 12. The device 10 can also be called an assembly, for example. The apparatus 11 can also be called a device, a machine, or an electronic device, for example. The heat dissipation structure 12 can also be called a cooling structure, a dissipation device, or a cooling device, for example.

As illustrated in the drawings, the X axis, the Y axis, and the Z axis are defined in this written description. Herein, the X axis, the Y axis, and the Z axis are orthogonal to each other. The X axis runs along the width of the device 10. The Y axis runs along the length of the device 10. The Z axis runs along the height of the device 10.

The apparatus 11 is a disaster-prevention radio transmitter, for example. However, that is not the only possible case. Alternatively, for example, the apparatus 11 can be some other device such as a rechargeable battery. Moreover, the apparatus 11 illustrated in FIG. 1 either can be the main body of a disaster-prevention radio unit or can be some part such as a substrate, an amplifier, or an inverter of a disaster-prevention radio unit.

The apparatus 11 transmits electromagnetic waves when a disaster occurs or during a test transmission, for example. While transmitting electromagnetic waves, the apparatus 11 produces more heat than during the standby state in which electromagnetic waves are not transmitted. That is, the apparatus 11 produces more heat during a short period of time when in operation. In other words, the period of time in which the apparatus 11 produces more heat is shorter than the period of time in which the apparatus 11 does not produce heat or produces only a small amount of heat.

The heat dissipation structure 12 includes a heatsink 21, a heat accumulation pack 22, and an attaching unit 23. The heatsink 21 is an example of a heat dissipating unit, and can also be called a heat dissipating member, a cooling member, or a heat transferring member, for example. The heat accumulation pack 22 is an example of a heat accumulating unit, and can also be called a heat accumulating member, a heat accumulating material, or a pack, for example. The attaching unit 23 is an example of a pressing unit, and can also be called a holding unit, a fixing unit, or a pushing unit, for example.

The heatsink 21 is made of an aluminum alloy, for example. However, that is not the only possible case. Alternatively, for example, the heatsink 21 can be made of some other material such as a metal, ceramics, or resin, for example.

The heatsink 21 includes a base 31 and a plurality of fins 32. The base 31 can also be called a contacting part, a connecting part, or a part, for example. The fins 32 are an example of at least one of extending parts, and can also be called protruding parts, protrusions, plates, or walls, for example.

The base 31 is formed to have the shape of a substantially quadrangular plate. However, that is not the only possible case. Alternatively, the base 31 can have some other shape such as a circular shape. As illustrated in FIG. 2, the base 31 has a first face 31a and a second face 31b.

The first face 31a is a substantially flat face oriented in the direction along the Z axis, and is facing a surface 11a of the apparatus 11. Although the surface 11a of the apparatus 11 is formed to be substantially flat in nature, it can alternatively be a curved face or an uneven face. The first face 31a makes contact with the surface 11a of the apparatus 11 either in a direct way or via a member such as a heat transferring sheet or grease. As a result, the heatsink 21 is thermally connected to the apparatus 11.

The second face 31b is positioned on the opposite side of the first face 31a, and is a substantially flat face oriented in the direction along the Z axis. In other words, the second face 31b is oriented toward the opposite side of the apparatus 11.

The fins 32 are formed in an integrated manner with the base 31. However, that is not the only possible case. Alternatively, the fins 32 can be formed independent of the base 31, and can be attached to the base 31. Each of the fins 32 extends from the second face 31b of the base 31 in the direction along the Z axis. Herein, the direction along the Z axis is an example of a first direction. Meanwhile, the fins 32 can alternatively extend in some other direction.

Each fin 32 has a distal end 32a, a proximal end 32b, and two side faces 32c. The distal end 32a is an example of a first end. The proximal end 32b is an example of a second end.

The distal end 32a is one end of the fin 32 in the direction along the Z axis, while the proximal end 32b is the other end of the fin 32 in the direction along the 3 axis. Thus, the proximal end 32b is positioned on the opposite side of the distal end 32a, and is positioned closer to the apparatus 11 as compared to the distal end 32a. The proximal end 32b is attached to the second face 31b of the base 31. The side faces 32c are substantially flat faces oriented in the direction along the X axis. Alternatively, the side faces 32c can be oriented in some other direction.

The fins 32 are arranged in the direction along the X axis with gaps C maintained therebetween. Each of the fins 32 extends in the direction along the Y axis. Herein, the direction along the X axis is an example of a second direction. In other words, the fins 32 are in a row along the X axis. Meanwhile, the fins 32 can be arranged in some other direction with the gaps C maintained therebetween. The side faces 32c of each fin 32 are oriented in the direction along the X axis. For that reason, the side faces 32c of the neighboring fins 32 face each other.

The heat accumulation pack 22 includes an accommodating unit 41, which can also be called a pack unit, a heat accumulating unit, a cooling unit, a filling unit, or a part, for example. In the accommodating unit 41, a heat storage material 42 is sealed. In other words, the accommodating unit 41 accommodates the heat storage material 42 in a liquid-tight manner.

The heat storage material 42 according to the first embodiment is a phase change material (PCM). In this written description, the PCM is also called a phase-change thermal storage material and has a higher heat storage density than that of water. The PCM is a material containing, for example, sodium acetate hydrate, sodium sulfate hydrate, or paraffin. However, that is not the only possible case. Alternatively, the heat storage material 42 can be some other heat storage material such as water.

The heat storage material 42 undergoes phase transition (phase change) between the solid state (solid phase) and the liquid state (liquid phase). The heat storage material 42 absorbs heat accompanying the phase transition from the solid state to the liquid state at the melting point, and dissipates heat accompanying the phase transition from the liquid state to the solid state at the freezing point.

The accommodating unit 41 according to the first embodiment is made of a first film 45 and a second film 46.

In other words, the accommodating unit 41 is film-like in shape. The first film 45 and the second film 46 are, for example, bonded together to form the accommodating unit 41.

The first film 45 and the second film 46 have, for example, bendability that enables deformation thereof due to the hydraulic pressure of the heat storage material 42 or due to an external pressure. In other words, the first film 45 and the second film 46 of the accommodating unit 41 get deformed due to the flow of the heat storage material 42 in the liquid state. Moreover, the first film 45 and the second film 46 are resistant to the heat storage material 42. That is, the first film 45 and the second film 46 are not easily corroded due to the heat storage material 42.

The accommodating unit 41 can alternatively be formed, for example, in a box-like shape having a predetermined stiffness. Such a type of the accommodating unit 41 maintains a predetermined shape and gets elastically deformed due to an increase in the hydraulic pressure of the heat storage material 42 or an increase in the external pressure. Meanwhile, the accommodating unit 41 is not limited to have a film-like shape or a box-like shape, and can be formed in some other shape too.

The first film 45 and the second film 46 are, for example, made of a synthetic resin such as vinyl, or a metal such as aluminum, or a compound material made of a plurality of laminated materials. Moreover, the material of the first film 45 can be different than the material of the second film 46.

Figure 3:
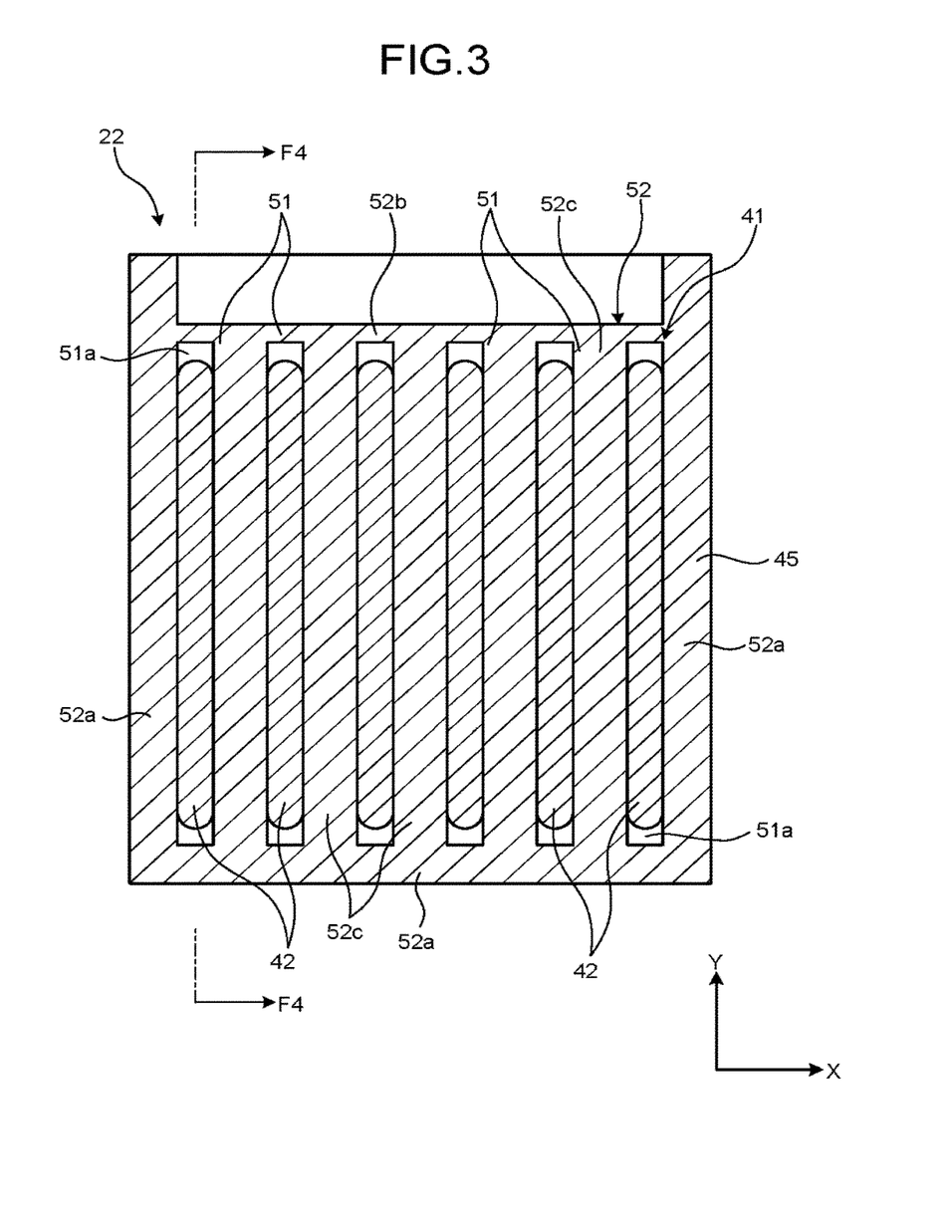
FIG. 3 is a cross-sectional view that schematically illustrates a heat accumulation pack according to the first embodiment, which is attached to a heatsink, along F3-F3 line illustrated in FIG. 2.
Figure 4:
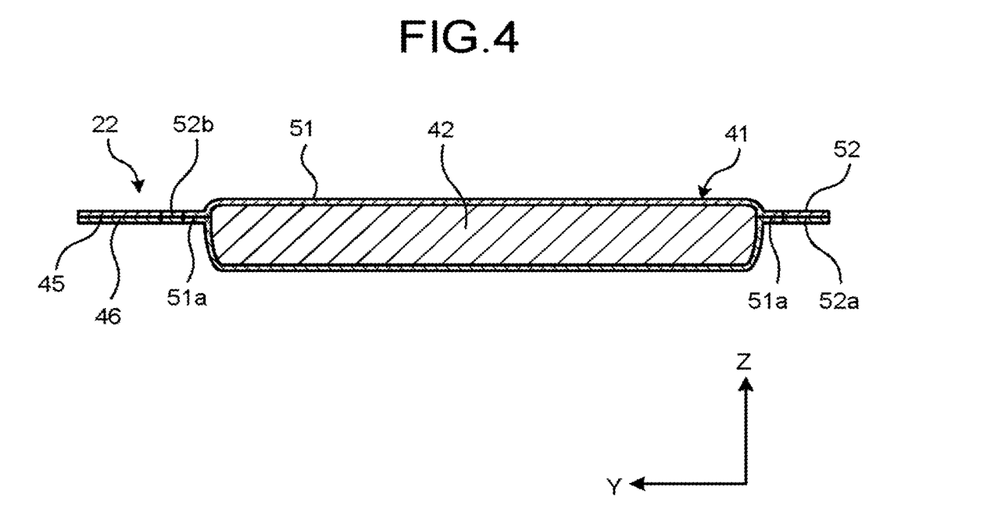
FIG. 4 is a cross-sectional view that schematically illustrates the heat accumulation pack according to the first embodiment along F4-F4 line illustrated in FIG. 3.

FIG. 3 is a cross-sectional view that schematically illustrates the heat accumulation pack 22 according to the first embodiment, which is attached to the heatsink 21, along F3-F3 line illustrated in FIG. 2. FIG. 4 is a cross-sectional view that schematically illustrates the heat accumulation pack 22 according to the first embodiment along F4-F4 line illustrated in FIG. 3. As illustrated in FIGS. 3 and 4, the accommodating unit 41 includes a plurality of sealing portions 51 and a partitioning portion 52. The sealing portions 51 can also be called as pack portions, accumulators, cooling portions, filled portions, or parts, for example. The partitioning portion 52 can also be called as a welded portion, a fixed portion, a zoning portion, an isolating portion, or a part, for example.

The sealing portions 51 are arranged in the direction along the X axis. Each of the sealing portions 51 extends in the direction along the Y axis. Inside each sealing portion 51, the heat storage material 42 is sealed. The inside of the sealing portions 51 in which the heat storage material 42 is sealed is the space formed between the first film 45 and the second film 46. The heat storage material 42, which is sealed inside the sealing portions 51, extends in the direction along the Y axis in accordance with the shape of the sealing portions 51.

The partitioning portion 52 is the portion in which the first film 45 is welded with the second film 46. However, that is not the only possible case. Alternatively, for example, the partitioning portion 52 can be the portion in which the first film 45 is bonded with the second film 46. The partitioning portion 52 includes three first outer edge portions 52a, a second outer edge portion 52b, and a plurality of intermediate portions 52c.

As illustrated in FIG. 3, the first film 45 is formed to be substantially quadrangular in shape. The second film 46 is also formed to be substantially quadrangular in shape. The three first outer edge portions 52a are formed along three edges from among the total of four edges (sides) of the first film 45 and the second film 46. In other words, the first outer edge portions 52a are the portions formed by welding three edges of the first film 45 with three edges of the second film 46.

The second outer edge portion 52b is formed at a distance from those single edges of the first film 45 and the second film 46 which do not form the first outer edge portion 52a. The second outer edge portion 52b extends in the direction along the X axis, along which the concerned edges of the first film 45 and the second film 46 extend, and connects the two first outer edge portions 2a that extend parallel to each other.

The intermediate portions 52c are formed in between the sealing portions 51. Thus, the intermediate portions 52c are arranged in the direction along the X axis, and each of the intermediate portions extends in the direction along the Y axis. The intermediate portions 52c connect between the sealing portions 51. Alternatively, the sealing portions 51 can be kept separated from each other without being connected using the intermediate portions 52c. That is, the accommodating unit 41 can include the sealing portions 51 as individual components.

The sealing portions 51 are partitioned from each other by the partitioning portion 52 that has the first outer edge portions 52a, the second outer edge portion 52b, and the intermediate portions 52c. Meanwhile, for example, the sealing portions 51 can be connected to each other at the end portions in the direction along the Y axis.

The heat storage material 42 according to the first embodiment is, for example, vacuum-sealed in the sealing portions 51. Thus, inside the sealing portions 51, only the heat storage material 42 is accommodated. Alternatively, inside the sealing portion 51, a gaseous matter such as air or an object other than the heat storage material 42 can also be accommodated.

Inside each sealing portion 51 is disposed a buffer portion 51a, which is an example of the portion in which the heat storage material in the liquid state can flow. Inside each sealing portion 51, the buffer portion 51a is the portion in which the first film 45 and the second film 46 are not welded. Thus, in the buffer portion 51a, the first film 45 and the second film 46 are separable from each other. Hence, the heat storage material 42 in the liquid state can flow in the buffer portion 51a between the first film 45 and the second film 46.

In other words, the volume of the heat storage material 42 sealed in the sealing portions 51 is smaller than the maximum volume of the sealing portions 51. The volume of the heat storage material 42 implies the volume thereof when in the solid state or the liquid state. The maximum volume of the sealing portions 51 is equal to the volume of an object with which the sealing portions 51 are completely filled.

As illustrated in FIG. 2, the sealing portions 51 are arranged in the gaps C maintained in between the fins 32. In other words, each sealing portion 51 is disposed in between two neighboring fins 32. The sealing portions 51 make contact with the side faces 32c of the fins 32 and thus get thermally connected to the fins 32.

Herein, the sealing portions 51 according to the first embodiment make direct contact with the side faces 32c of the fins 32. Alternatively, the sealing portions 51 can be fixed to the side faces 32c of the fins 32 using, for example, a heat conductive adhesive, and can get thermally connected to the fins 32 by making contact with the side faces 32c of the fins 32 via the heat conductive adhesive.

The heat accumulation pack 22 is made to be in contact with the distal ends 32a of the fins 32. For that reason, the sealing portions 51 are inserted in the gaps C, which are maintained between the fins 32, from the side of the distal ends 32a of the fins 32. Alternatively, the sealing portions 51 can be inserted in the gaps C from some other direction.

Each side face 32c of each fin 32 has a first area A1 and a second area A2. The sealing portion 51 makes contact with the area A1. In other words, the first area A1 is covered by the sealing portion 51. The second area A2 remains exposed without being covered by the sealing portion 51. In other words, the second area A2 is in contact with the outside air.

The first area A1 is the portion in the vicinity of the distal end 32a of the corresponding fin 32. That is, the first area A1 is closer to the distal end 32a as compared to the second area A2. In this way, the sealing portions 51 are thermally connected to the side faces 32c of the fins 32 at positions away from the proximal ends 32b of the fins 32 and closer to the distal ends 32a than to the proximal ends 32b.

As a result of arranging the sealing portions 51 in the gaps C maintained between the fins 32, the intermediate portions 52c of the partitioning portion 52 are supported by the distal ends 32a of the fins 32. Moreover, the sealing portions 51 can also be supported by the distal ends 32a of the fins 32.

The attaching unit 23 includes a pressing member 61 and a spring member 62 that is illustrated in FIG. 2. As illustrated in FIG. 1, the pressing member 61 is formed in a substantially quadrangular plate shape. However, that is not the only possible case. Alternatively, the pressing member 61 can be formed in some other shape such as a circular shape.

As illustrated in FIG. 2, the pressing member 61 has a third face 61a and a fourth face 61b. The first face 61a faces the distal ends 32a of the fins 32 across the heat accumulation pack 22. In other words, the heat accumulation pack 22 is present in between the pressing member 61 and the distal ends 32a of the fins 32. The third face 61a makes contact with the sealing portions 51 of the accommodating unit 41. The fourth face 61b is positioned on the opposite side of the third face 61a.

The spring member 62 includes two attaching portions 62a and a biasing portion 62b. The two attaching portions 62a are attached to, for example, the base 31 of the heatsink 21. Alternatively, the attaching portions 62a can be attached to some other part such as the apparatus 11.

The biasing portion 62b is disposed in between the two attaching portions 62a. Moreover, the biasing portion 62b makes contact with the fourth face 61b of the pressing member 61. Herein, the biasing portion 62b is a leaf spring that elastically presses the pressing member 61 toward the distal ends 32a of the fins 32. However, that is not the only possible case. Alternatively, for example, the spring member 62 can be a coil spring that elastically presses the pressing member 61 toward the distal ends 32a of the fins 32.

As a result of being pressed by the biasing portion 62b, the pressing member 61 presses the sealing portions 51 of the heat accumulation pack 22. Herein, the pressing member 61 presses the sealing portions 51 toward the inside of the gaps C, in which the sealing portions 51 are arranged. In other words, the pressing member 61 presses the sealing portions 51 in the direction of extension of the fins 32 (i.e., in the direction along the Z axis).

When the pressing member 61 presses the sealing portions 51, if the heat accumulation member 42 is in the liquid state, the heat accumulation member 42 that is sealed in the sealing portions 51 spreads in the direction toward the side faces 32c of the fins 32 (i.e., in the direction along the X axis).

In addition to spreading toward the side faces 32c of the fins 32, the heat storage material 42 also spreads, for example, in the direction toward the base 31 of the heatsink 21 (i.e., in the direction along the Z axis, or the downward direction).

As a result of the spread of the heat storage material 42, the sealing portions 51 in which the heat storage material 42 is sealed get pressed against the side faces 32c of the fins 32. That is, the attaching unit 23 presses the heat accumulation pack 22, so that the sealing portions 51 are pressed against the fins 32. That keeps the sealing portions 51 in close contact with the fins 32.

Figure 5:
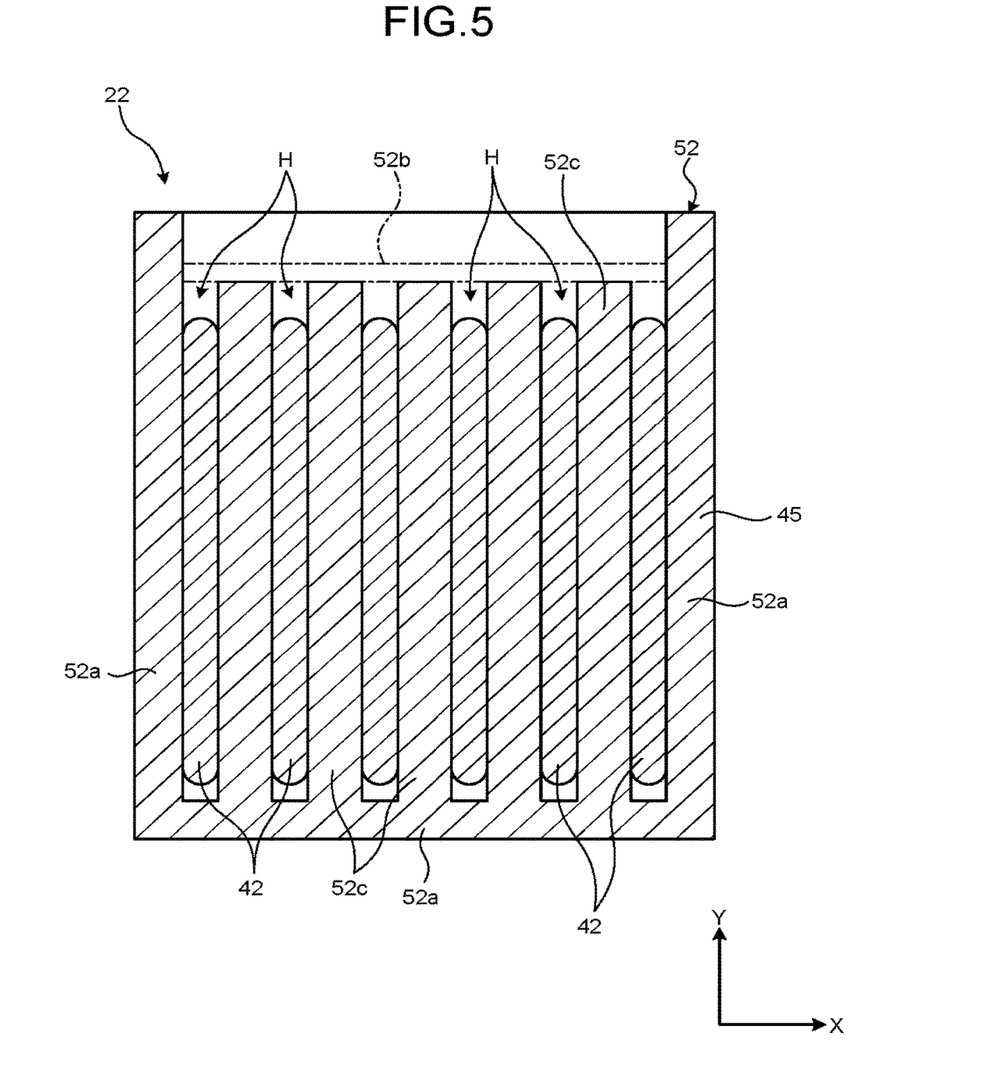
FIG. 5 is a cross-sectional view of the heat accumulation pack during the manufacturing thereof according to the first embodiment.

Given below is the explanation of one of the methods for manufacturing the device 10. However, the method of manufacturing the device 10 is not limited to the method explained below, and it is possible to implement some other method. FIG. 5 is a cross-sectional view of the heat accumulation pack 22 during the manufacturing thereof according to the first embodiment.

As illustrated in FIG. 5, firstly, when the first film 45 and the second film 46 are, for example, welded to each other, it results in the formation of the three first outer edge portions 52a and the intermediate portions 52c of the partitioning portion 52. As a result, in between the first outer edge portions 52a and the intermediate portions 52c as well as in between a plurality of intermediate portions 52c, hollow spaces H are formed. Each of the hollow spaces H extends in the direction along the Y axis and that has one of the ends in the direction along the Y axis as the opened end.

Subsequently, the heat storage material 42 is supplied into each hollow space H. Herein, either the heat storage material 42 in the liquid state can be supplied into the hollow spaces H or the heat storage material 42 in the powder form can be supplied into the hollow spaces H. The heat storage material 42 that is supplied into the hollow spaces H has a smaller volume than the volume of the hollow spaces H.

Subsequently, when the first film 45 and the second film 46 are, for example, welded to each other, the second outer edge portion 52b of the partitioning portion 52 is formed. In FIG. 5, the portion in which the second outer edge portion 52b is formed is illustrated with a two-dot chain line.

Figure 6:
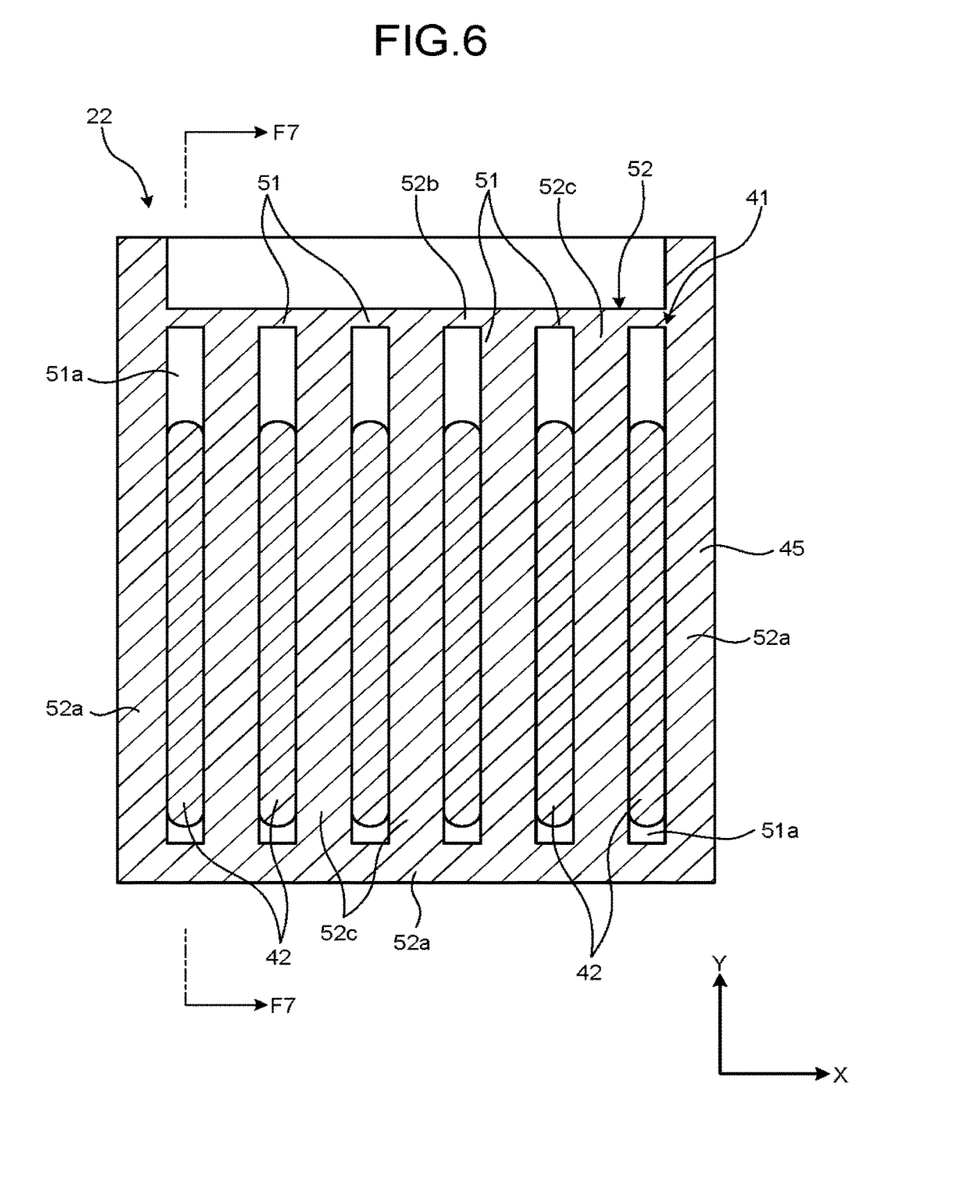
FIG. 6 is a cross-sectional view illustrating an example of the heat accumulation pack according to the first embodiment.
Figure 7:
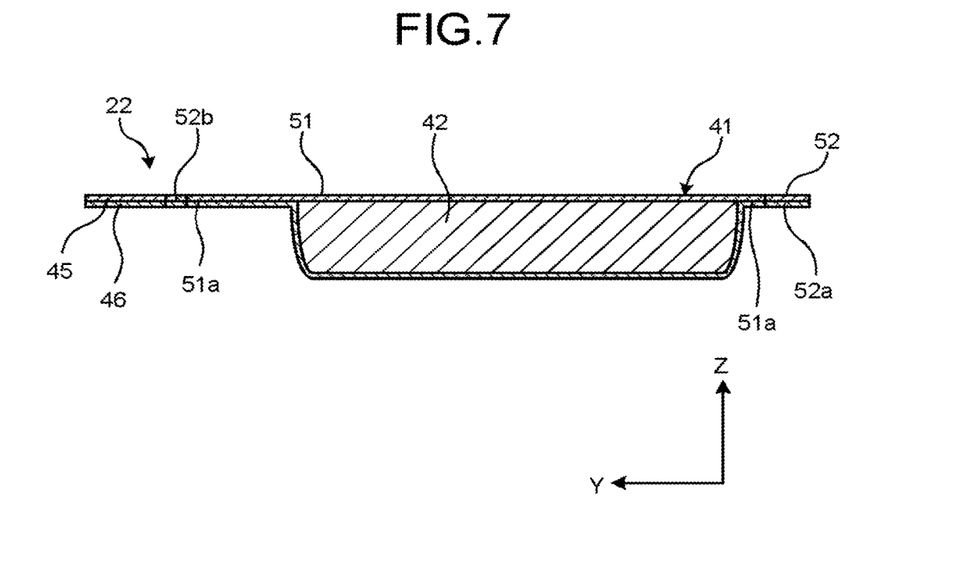
FIG. 7 is a cross-sectional view that schematically illustrates the example of the heat accumulation pack according to the first embodiment along F7-F7 line illustrated in FIG. 6.

FIG. 6 is a cross-sectional view illustrating an example of the heat accumulation pack 22 according to the first embodiment. FIG. 7 is a cross-sectional view that schematically illustrates the example of the heat accumulation pack 22 according to the first embodiment along F7-F7 line illustrated in FIG. 6. As illustrated in FIG. 6, as a result of the formation of the second outer edge portion 52b, the opened ends of the hollow spaces H are closed and the sealing portions 51 are formed in which the heat storage material 42 gets sealed. When the second outer edge portion 52b of the partitioning portion 52 is formed, air is removed from the hollow spaces H. As a result, as described earlier, the heat storage material 42 is vacuum-sealed in the sealing portions 51.

Figure 8:
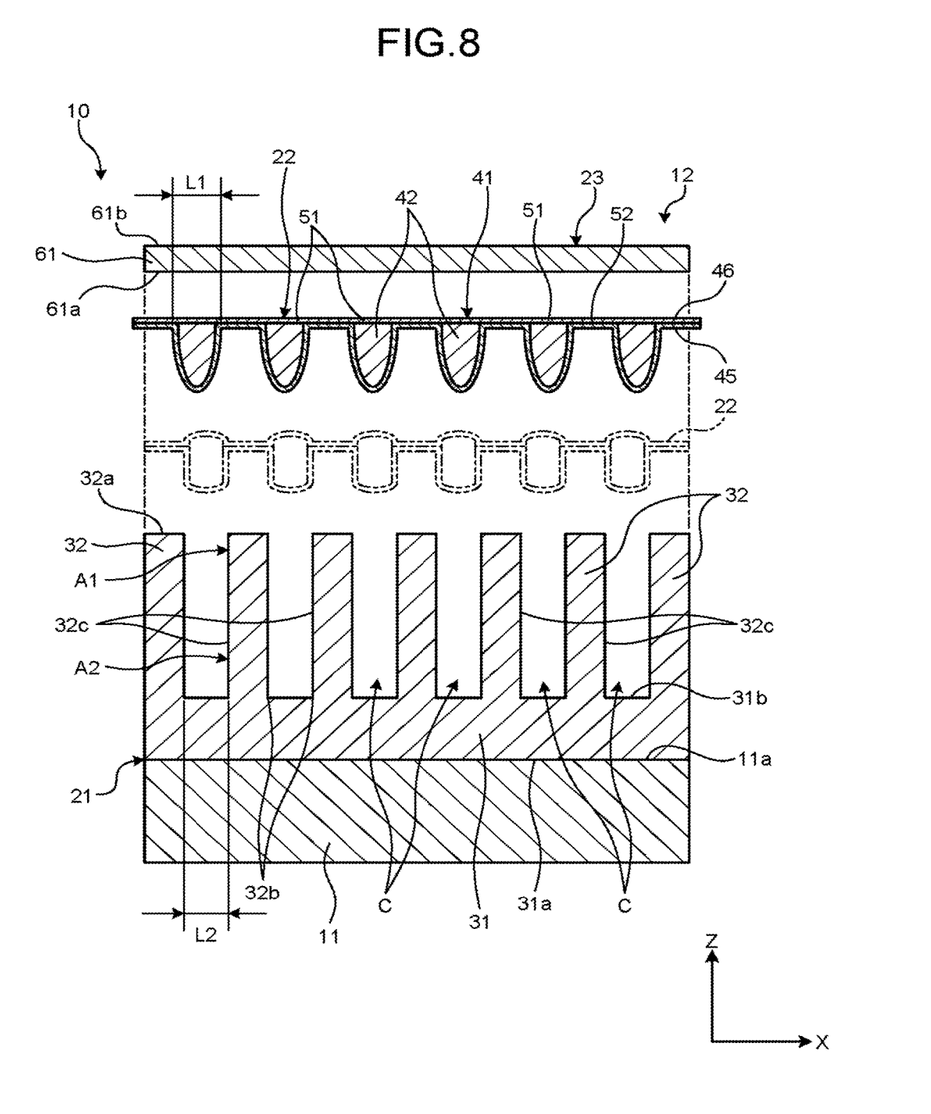
FIG. 8 is an exploded cross-sectional view of the device during the manufacturing thereof according to the first embodiment.

FIG. 8 is an exploded cross-sectional view of the device 10 during the manufacturing thereof according to the first embodiment. As illustrated in FIG. 8, a length L1 of the sealing portions 51 in the direction along the X axis can be set to be greater than a length L2 of the gaps C in the direction along the X axis. For example, the length L2 can also be called the pitch of the fins 32.

For example, when the heat accumulation pack 22 is extended to the utmost extent in the direction along the X axis, the length L1 of the sealing portions 51 in the direction along the X axis is greater than the length L2 of the gaps C in the direction along the X axis. In this way, the heat accumulation pack 22 is partitioned in such a way that the sealing portions 51 are formed with the width L1 that is greater than the pitch L2 of the fins 32.

For example, when the heat storage material 42 is in the liquid state, the heat accumulation pack 22 is deformable. For example, the heat accumulation pack 22 can be shortened in the direction along the X axis so that the length L1 of the sealing portions 51 in the direction along the X axis becomes smaller.

Subsequently, the heat accumulation pack 22 is attached to the heatsink 21. For example, the heat accumulation pack 22 is heated to a temperature higher than the melting point of the heat storage material 42. As a result, the heat storage material 42 becomes liquid and deformable (flowable).

When the heat storage material 42 is in the liquid state, the sealing portions 51 in which the heat storage material 42 is sealed are inserted in the gaps C maintained between the fins 32. At that time, in order to ensure that the sealing portions 51 are inserted in the gaps C, the heat accumulation pack 22 is shortened in the direction along the X axis. As a result, the length L1 of the sealing portions 51 in the direction along the X axis becomes substantially equal to the length L2 of the gaps C in the direction along the X axis. In FIG. 8, the shortened heat accumulation pack 22 is illustrated with two-dot chain lines.

Subsequently, the third face 61a of the pressing member 61 is made to be in contact with the sealing portions 51 of the heat accumulation pack 22. In that state, the spring member 62 illustrated in FIG. 2 is attached to the heatsink 21 and the pressing member 61. As a result, the attaching unit 23 presses the heat accumulation pack 22, so that the sealing portions 51 are pressed against the fins 32.

Subsequently, in the state in which the sealing portions 51 are in close contact with the fins 32, the heat accumulation pack 22 is cooled. As a result, the heat storage material 42 becomes solid. Once the heat storage material 42 is in the solid state, the sealing portions 51 in which the heat storage material 42 is sealed can be inserted in the gaps C maintained between the fins 32. In this way, the device 10 gets manufactured. In the manufacturing process explained above, it becomes possible to reduce the number of times for which the heat storage material 42 is changed to the liquid state, and make it unnecessary to mix the heat storage material 42 with some other material or to agitate the heat storage material 42.

In the device 10, the heat dissipation structure 12 cools the apparatus 11 in the manner explained below, for example. However, the method explained below is not the only method by which the heat dissipation structure 12 can cool the apparatus 11.

Figure 9:
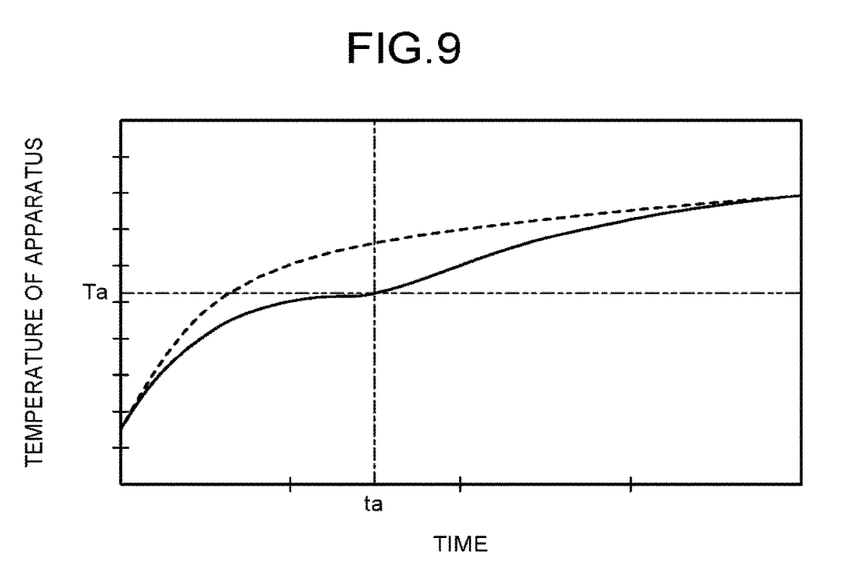
FIG. 9 is a graph illustrating an example of the variation in temperature of an apparatus in operation according to the first embodiment.

FIG. 9 is a graph illustrating an example of the variation in temperature of the apparatus 11 in operation according to the first embodiment. In FIG. 9, the horizontal axis represents the elapsed time since the apparatus 11 starts producing heat, while the vertical axis represents the temperature of the surface 11a of the apparatus 11.

In FIG. 9, the solid line is the variation in temperature of the surface 11a of the apparatus 11 in the case in which the heat dissipation structure 12 according to the first embodiment cools the apparatus 11. Moreover, in FIG. 9, as a comparison example, the dashed line is the variation in temperature of the surface 11a of the apparatus 11 in the case in which only the heatsink 21 is used in cooling the apparatus 11.

The heat dissipation structure 12 according to the first embodiment is set in such a way that, for example, during the period of time up to a time ta illustrated with a dashed-dotted line, the temperature of the surface 11a of the apparatus 11 is maintained to be lower than a temperature Ta illustrated with a two-dot chain line. However, the setting of the heat dissipation structure 12 is not limited to this example.

The time ta is, for example, the supposed maximum value of the period of time for which the apparatus 11 operates to produce heat. The temperature Ta is, for example, the maximum value of the temperature at which the apparatus 11 is recommended to operate. However, the time ta and the temperature Ta are not limited to these values.

In the device 10 according to the first embodiment, the heat produced by the apparatus 11 transfers from the base 31 of the heatsink 21 to the fins 32. Then, in the second areas A2 of the side faces 32c, the fins 32 are cooled due to the natural convection of air. In other words, the heat that has transferred to the fins 32 transfers to the inside of the fins 32 toward the first areas A1 while being discharged to the outside air in the second areas A2.

The heat that has transferred to the first areas A1 then transfers to the heat storage material 42, which is sealed in the sealing portions 51, via the sealing portions 51 of the heat accumulation pack 22 which is in contact with the first areas A1. In this way, the fins 32 are cooled due to the heat storage material 42 via the sealing portions 51.

The temperature of the heat storage material 42 increases due to the heat of the apparatus 11 that has transferred via the fins 32 and the sealing portions 51. Herein, the temperature of the heat storage material 42, which is in the solid state, increases due to the heat applied thereto until the temperature reaches the melting point of the heat storage material 42.

When the temperature of the heat storage material 42 reaches the melting point, the heat storage material 42 undergoes phase transition from the solid state to the liquid state. Accompanying the phase transition from the solid state to the liquid state, the heat storage material 42 absorbs heat. Hence, during the phase transition, until a predetermined amount of heat is received, the heat storage material 42 is kept at a constant temperature (the melting point).

The melting point of the heat storage material 42 is, for example, set to be equal to the temperature Ta or set to be lower than the temperature Ta. During the phase transition of the heat storage material 42, the temperature thereof is maintained at the melting point. Hence, at least until the completion of the phase transition of the heat storage material 42, the temperature of the surface 11a of the apparatus 11 is maintained to be lower than the temperature Ta. Meanwhile, the melting point of the heat storage material 42 can alternatively be set to be higher than the temperature Ta.

As described above, since the heat storage material 42 absorbs heat accompanying the phase transition from the solid state to the liquid state, at least until the completion of the phase transition of the heat storage material 42, there is only a moderate increase in the temperature of the surface 11a of the apparatus 11. Hence, the temperature of the surface 11a of the apparatus 11 is maintained to be lower than the temperature Ta up to the time ta. In contrast, as illustrated by the dashed line in FIG. 9, in the case of cooling the apparatus 11 using only the heatsink 21, the temperature of the surface 11a of the apparatus 11 reaches the temperature Ta before the elapse of the time ta.

Given below is the explanation of an exemplary design procedure regarding the weight of the heat storage material 42 according to the first embodiment.

$A_{FIN}$: the area [m$^2$] of the fins 32 that is in contact with the outside air $A_{PCM, OUT}$: the area [m$^2$] of the heat storage material 42 that is in contact with the outside air $A_{PCM, IN}$: the area [m$^2$] of the heat storage material 42 that is in contact with the fins 32

$C_{PCM, L}$: the specific heat [J/(Kg·K)](a physical property) of the heat storage material 42 in the liquid state $C_{PCM, S}$: the specific heat [J/(Kg·K)](a physical property) of the heat storage material 42 in the solid state $C_S$: the heat capacity [J/K] of the apparatus 11 that produces heat g: gravitational acceleration [m/s$^2$]

H: the height [m] of the apparatus 11 that produces heat $k_{AIR}$: the thermal conductivity [W/(m·K)](a physical property) of air at a temperature $T_{AIR}$ $k_{FIN}$: the thermal conductivity [W/(m·K)](a physical property) of the material of the fins 32

$k_{PCM}$: the thermal conductivity [W/(m·K)](a physical property) of the heat storage material 42

L: the length [m] of the fins 32

Pr: the Prandtl number [−](a physical property) of air at the temperature $T_{AIR}$ $t_{PCM}$: the thickness [m] of the heat storage material 42

$T_{AIR}$: the temperature of air, 38° C.

$T_{mp}$: the meting point [° C.] of the heat storage material 42

V: the volume [m$^3$] of the heat storage material 42

$y_b$: the length [m] equal to half of the thickness of the fins 32

β: the coefficient of cubic expansion [1/K](a physical property) of air at the temperature $T_{AIR}$ ν: the kinetic viscosity [m$^2$/s] (a physical property) of air at the temperature $T_{AIR}$ Δhf: the latent heat of fusion [J/kg] (a physical property) of the heat storage material 42

ρ: the density [kg/m$^3$](a physical property) of the heat storage material 42

Because the air flows according to natural convection over the surfaces of the fins 32 and the heat accumulation pack 22, when the physical properties and the dimensions are defined as above, coefficients of heat transfer are obtained as below:

coefficient of heat transfer $h_{NC,S}$ of the fins 32 due to natural convection becomes $h_{NC,S} = 4/3 \cdot C \cdot Ra_S^{0.25} \cdot k_{AIR}/H$ coefficient of heat transfer $h_{NC,PCM}$ of the surface of the heat accumulation pack 22 due to natural convection becomes $h_{NC, PCM} = 4/3 \cdot C \cdot Ra_{PCM}^{0.25} \cdot k_{AIR}/H$ Herein, the coefficients of heat transfer are obtained using:

$$C = 3/4 \cdot (Pr/(2.4 + 4.9 \cdot Pr^{0.5} + 5 \cdot Pr))^{0.25}$$

$$Gr_S = g \cdot \beta \cdot |T_S - T_{AIR}| \cdot H^3/(\nu^2)$$

$$Ra_S = Gr_S \cdot Pr$$

$$Gr_{PCM} = g \cdot \beta \cdot |T_{PCM} - T_{AIR}| \cdot H^3/(\nu^2)$$

$$Ra_{PCM} = Gr_{PCM} \cdot Pr$$

Moreover, the fin efficiency and the fin tip temperature are obtained using:

$$m = (h_{NC,S}/(k_{FIN} \cdot y_b))^{0.5}$$

$$u_b = m \cdot L$$

fin efficiency $\phi = \tan h(u_b)/u_b$ fin tip temperature $T_{FIN} = T_{AIR} + (T_S - T_{AIR})/\cos h(u_b)$ Using those values, following values are obtained.

heat discharge $Q_{FIN}$ from the fins becomes $$Q_{FIN} = \phi \cdot h_{NC,S} \cdot A_{FIN} \cdot (T_S - T_{AIR})$$

heat discharge $Q_{PCM,\ OUT}$ from the surface of the heat accumulation pack becomes $Q_{PCM,\ OUT} = h_{NC,\ PCM} \cdot A_{PCM,\ OUT} \cdot (T_{PCM} - T_{AIR})$ amount of heat transferred $Q_{PCM,\ IN}$ from the fin to the heat accumulation pack becomes $Q_{PCM,\ IN} = k_{PCM}/(t_{PCM}/2) \cdot A_{PCM,\ IN} \cdot (T_{FIN} - T_{PCM})$ Then, $Q_{FIN}$, $Q_{PCM,\ OUT}$, and $Q_{PCM,\ IN}$ are used as follows.

When $\Delta t$ represents the value equal to or smaller than 1/10-th of a desired temperature maintenance period $t_{upkeep}$; the temperature $T_S$ [° C.] of a heat source, the temperature $T_{PCM}$ [° C.] of the heat storage material 42, and a calorific value $Q_S$ [W] of the heat source, at a particular time t, are used and a temperature $T_S'$ [° C.] of the heat source and a temperature $T_{PCM}'$ [° C.] after $\Delta t$ seconds from the time t are obtained according to the following:

the specific enthalpy $h_{PCM}'$ of the heat storage material 42 after $\Delta t$ seconds from the time t $$h_{PCM}' = h_{pcm} + (Q_{PCM,IN} - Q_{PCM,OUT})/(\rho \cdot V) \cdot \Delta t;$$

the temperature $T_{PCM}'$ of the heat accumulation pack 22 after $\Delta t$ seconds from the time t $T_{PCM}' =$
1) when $h_{PCM}' < C_{PCM,\ L} \cdot T_{mp}$ is satisfied, $h_{PCM}'/C_{PCM,\ L}$
2) when $C_{PCM,\ L} \cdot T_{mp} \leq h_{PCM}' < C_{PCM,\ L} \cdot T_{mp} + \Delta h_f$ is satisfied, $T_{mp}$
3) when $h_{PCM}' \geq C_{PCM,\ L} \cdot T_{mp} + \Delta h_f$ is satisfied, $\{h_{PCM}' - (C_{PCM,\ L} \cdot T_{mp} + \Delta h_f)\}/C_{PCM,\ S} + T_{mp}$; and the temperature $T_S'$ of the apparatus 11, which produces heat, after $\Delta t$ seconds from the time t $$T_S' = T_S + (Q_S - Q_{FIN} - Q_{PCM,IN}) \cdot \Delta t/C_S.$$

With that, the initial value at the time indicating 0 seconds is set as:

$h_{PCM} =$ i) when $T_{AIR} < T_{mp}$ is satisfied, $C_{PCM,\ S} \cdot T_{AIR}$
ii) when $T_{AIR} = T_{mp}$ or when $T_{AIR} > T_{mp}$ is satisfied, $$C_{PCM,S} \cdot T_{mp} + \Delta h_f + C_{PCM,L} \cdot (T_{AIR} - T_{mp})$$

$$T_{PCM} = T_{AIR}$$

$$T_S = T_{AIR}$$

As a result, the temperature $T_S$ of the apparatus 11, which produces heat from the time indicating 0 seconds up to the desired temperature maintenance period $t_{upkeep}$, and the volume V of the heat storage material 42 are adjusted in such a way that the temperature $T_S$ of the apparatus 11, which produces heat from the time indicating 0 seconds up to the desired temperature maintenance period $t_{upkeep}$, is equal to or smaller than the desired temperature, to obtain the volume V of the heat storage material 42. Then, the density $\rho$ of the heat storage material 42 is multiplied to the volume V so as to obtain the weight. However, by taking into account any unexpected increase in the air temperature, disturbances in the natural convection due to the surrounding structures, and the heterogeneous character of the heat accumulation pack 22; the volume for installing the heat storage material 42 is set to be equal to or greater than the volume V.

In the device 10 according to the first embodiment, the accommodating unit 41, in which the heat storage material 42 is sealed, is thermally connected to the fins 32 of the heatsink 21. As a result, the heat produced in the apparatus 11 transfers to the heat storage material 42 via the fins 32 and the accommodating unit 41. Because of the heat transferring to the heat storage material 42, the apparatus 11 gets cooled. Hence, as compared to the case in which the apparatus 11 is cooled using only the heatsink 21, the heat dissipation structure 12 can be prevented from increasing in size. Moreover, the heat that has transferred from the apparatus 11 to the fins 32 of the heatsink 21 gets absorbed in the heat storage material 42 accompanying the phase transition thereof from the solid state to the liquid state. For that reason, if the melting point of the heat storage material 42 is set to a desired value, at least until the completion of the phase transition of the heat storage material 42, the temperature of the apparatus 11 is prevented from exceeding the desired temperature Ta. Furthermore, for example, it is not necessary to mix the heat storage material 42 with some other object, thereby making it possible to fill almost the entire volume of the accommodating unit 41 with the heat storage material 42. Hence, using a smaller volume of the heat storage material 42, the apparatus 11 can be prevented from having an increase in the temperature. That enables achieving prevention in an increase in the size of the heat dissipation structure 12.

The accommodating unit 41 makes contact with the fins 32 and gets thermally connected to the fins 32. That is, the accommodating unit 41 is directly and thermally connected to the fins 32. As a result, as compared to the case in which the accommodating unit 41 is indirectly and thermally connected to the heat storage material 42, it is possible to reduce the thermal resistance between the heat storage material 42 and the fins 32.

The accommodating unit 41 is configured to undergo deformation due to the flow of the heat storage material 42 in the liquid state. That is, when the heat storage material 42 is changed to the liquid state, the accommodating unit 41 becomes deformable. For that reason, for example, the accommodating unit 41 can be easily brought into contact with the fins 32, and a greater area of contact can be set between the accommodating unit 41 and the fins 32. Consequently, it becomes possible to reduce the thermal resistance between the heat storage material 42 and the fins 32.

The sealing portions 51, in which the heat storage material 42 is sealed and which are partitioned from each other, are arranged in the gaps C maintained between the fins 32. That enables achieving prevention in an increase in the size of the heat dissipation structure 12. Moreover, since the sealing portions 51 are thermally connected to the side faces 32c of the fins 32, a greater area of contact can be set between the sealing portions 51 and the fins 32. Consequently, it becomes possible to reduce the thermal resistance between the heat storage material 42 and the fins 32.

The length L1 of the sealing portions 51 in the direction along the X axis can be set to be greater than the length L2 of the gaps C maintained between the fins 32 in the direction along the X axis. As a result, the sealing portions 51, in which the heat storage material 42 is sealed, are reliably brought in contact with the fins 32 forming the gaps C. Consequently, it becomes possible to reduce the thermal resistance between the heat storage material 42 and the fins 32.

The attaching unit 23 presses the heat accumulation pack 22 so that the accommodating unit 41 is pressed against the fins 32. As a result, it becomes easier to increase the area of contact between the accommodating unit 41 and the fins 32, thereby enabling achieving reduction in the thermal resistance between the heat storage material 42 and the fins 32. For example, upon being heated, the heat storage material 42 undergoes phase transition and becomes able to flow inside the sealing portions 51 of the accommodating unit 41. In that state, when the attaching unit 23 presses the accommodating unit 41 against the fins 32, the sealing portions 51 of the accommodating unit 41 deform in such a way that the area of contact between the sealing portions 51 and the fins 32 expands. Moreover, there occurs an increase in the contact pressure at the contact surfaces between the sealing portions 51 and the fins 32. As a result, it becomes possible to reduce the thermal resistance between the heat storage material 42 and the fins 32.

The attaching unit 23 presses the sealing portions 51 toward the inside of the gaps C maintained between the fins 32. As a result, as compared to the case in which the attaching unit 23 presses the sealing portions 51 toward the fins 32; the fins 32 are prevented from getting deformed by the pressed sealing portions 51, or the sealing portions 51 are prevented from getting damaged due to the fins 32. Moreover, the sealing portions 51 are prevented from coming off the gaps C maintained between the fins 32. For example, when the heat storage material 42 undergoes phase transition upon being heated, there is an increase in the volume of the heat storage material 42. Consequently, the volume of the sealing portions 51, in which the heat storage material 42 is sealed, also increases. Thus, the sealing portions 51 expand in the direction of coming off the gaps C (for example, in the upward direction with reference to FIG. 2). However, since the attaching unit 23 presses the sealing portions 51 into the gaps C (in the downward direction with reference to FIG. 2), the sealing portions 51 are prevented from coming off the gaps C maintained between the fins 32.

The attaching unit 23 elastically presses the heat accumulation pack 22. As a result, even if the heat storage material 42 undergoes expansion or contraction, the heat accumulation pack 22 is constantly pressed by the attaching unit 23. Hence, for example, when the heat storage material 42 undergoes contraction, the accommodating unit 41 is prevented from moving away from the fins 32. Consequently, it becomes possible to reduce the thermal resistance between the heat storage material 42 and the fins 32.

The fins 32 have the first areas A1 that are covered by the accommodating unit 41, and have the second areas A2 that remain exposed. Thus, the heat is dissipated to the outside air from the second areas A2. Hence, for example, as compared to the case in which the entire area of the fins 32 is covered, there is a longer period of time until the completion of the phase transition of the heat storage material 42. With that, it becomes possible to reliably prevent a situation in which the temperature of the apparatus 11 exceeds the desired temperature Ta. Moreover, even after the heat storage material 42 completes the phase transition, the heat can be dissipated from the fins 32.

The sealing portions 51 are thermally connected to the fins 32 at positions separated from the proximal ends 32b of the fins 32. As a result, in the fins 32, the portions (the second areas A2) present between the proximal ends 32b and the portions connected to the sealing portions 51 enable heat dissipation in the air. That is, the heat that transfers from the apparatus 11 to the heatsink 21 transfers to the heat storage material 42 after getting dissipated in the air from the second areas A2. As a result, for example, as compared to the case in which the sealing portions 51 are thermally connected to the proximal ends 32b, there is an increase in the period of time until the completion of the phase transition of the heat storage material 42. Thus, until the desired time ta, the temperature of the apparatus 11 is reliably prevented from exceeding the desired temperature Ta.

The sealing portions 51 are thermally connected to the fins 32 at positions closer to the distal ends 32a than to the proximal ends 32b. As a result, as compared to the case in which the sealing portions 51 are thermally connected to the fins 32 at positions closer to the proximal ends 32b than to the distal ends 32a, there is an increase in the distance from the first areas A1 to the proximal ends 32b in the fins 32. Therefore, there is an increase in the period of time until the completion of the phase transition of the heat storage material 42. Thus, until the desired time ta, the temperature of the apparatus 11 is more reliably prevented from exceeding the desired temperature Ta.

The volume of the heat storage material 42, which is sealed in the sealing portions 51, has a smaller volume than the maximum volume of the sealing portions 51. Hence, inside each sealing portion 51 is provided with the buffer portion 51a in which the heat storage material 42 in the liquid state can flow. With that, even if the heat storage material 42 undergoes thermal expansion, it can still flow in the buffer portions 51a, thereby preventing the sealing portions 51 from getting damaged.

The accommodating unit 41 has a film-like shape. Hence, the accommodating unit 41 is easily deformable due to the flow of the heat storage material 42 in the liquid state. Moreover, since the accommodating unit 41 is thin in nature, it becomes possible to reduce the thermal resistance between the heat storage material 42 and the fins 32.

As heat storage material 42, a phase change material (PCM) is used. The PCM is identical to a sensible heat storage material in that, when heat is applied to the PCM of which temperature is lower than the melting point, the PCM absorbs the heat as sensible heat until the temperature of the PCM reaches the melting point. However, unlike a sensible heat storage material, regarding a phase change material, when the temperature reaches the melting point and the phase change material undergoes phase transition, there is no change in the temperature while absorbing the heat as latent heat. Moreover, the use of not only sensible heat but also latent heat results in a greater heat storage capacity in a phase change material than that in a sensible heat storage material.

Figure 10:
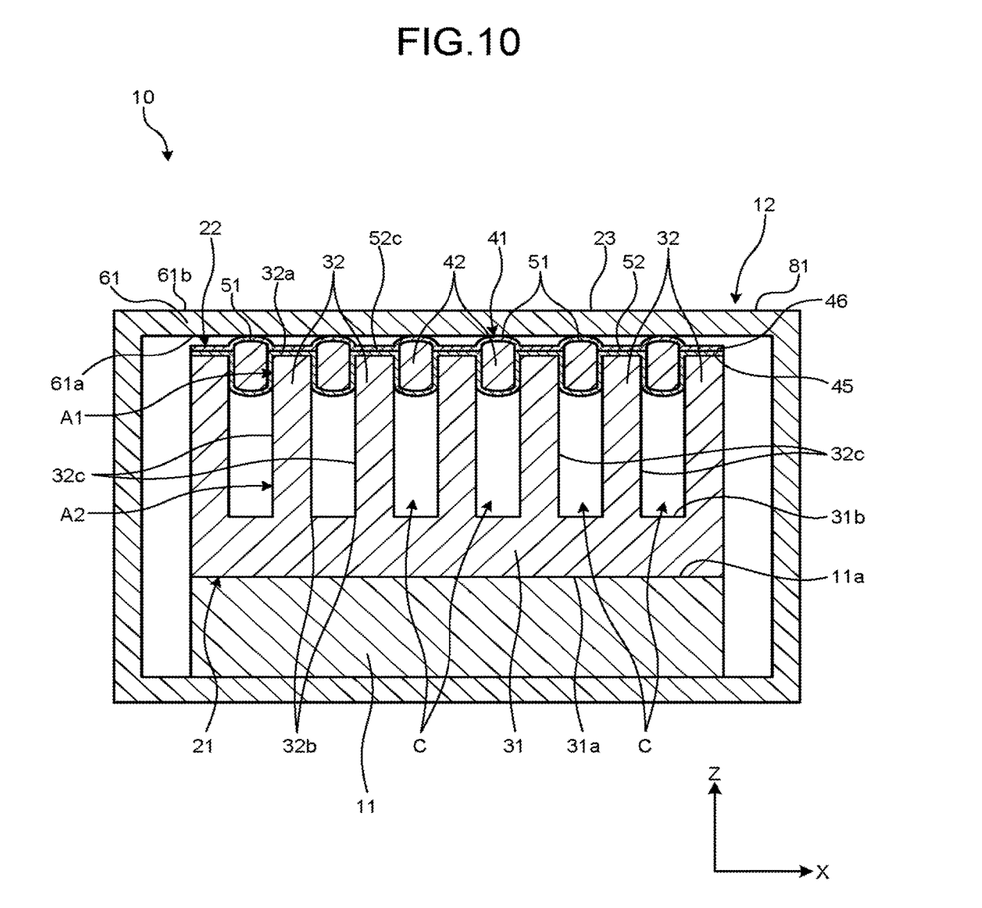
FIG. 10 is a cross-sectional view that schematically illustrates the device according to a second embodiment.

Explained below with reference to FIG. 10 is a second embodiment. In the explanation of the second embodiment, constituent elements having identical functions to the already-explained constituent elements are referred to by the same reference numerals and the explanation thereof may be omitted. A plurality of constituent elements referred to by the same reference numeral need not have all functions and qualities to be common. That is, the constituent elements can have different functions and qualities according to the embodiments.

FIG. 10 is a cross-sectional view that schematically illustrates the device 10 according to the second embodiment. As illustrated in FIG. 10, the heat dissipation structure 12 according to the second embodiment includes a housing 81 in place of the attaching unit 23 according to the first embodiment.

The housing 81 houses the apparatus 11, the heatsink 21, and the heat accumulation pack 22. Moreover, the housing 81 includes the pressing member 61. Herein, the pressing member 61 according to the second embodiment is an example of a pressing unit.

The pressing member 61 is a part of the housing 81, the pressing member 61 forms, for example, a part of the wall of the housing 81. The pressing member 61 presses the heat accumulation pack 22 in the same way as the pressing member 61 according to the first embodiment, so that the sealing portions 51 are pressed against the fins 32.

In the device 10 according to the second embodiment, the housing 81 accommodates the heatsink 21 and the heat accumulation pack 22, and includes the pressing member 61. That prevents an increase in the size of the heat dissipation structure 12.

According to at least one of the embodiments described above, the accommodating unit inside which the heat storage material is sealed is thermally connected to the extending part of the heat dissipating unit. That prevents an increase in the size of the heat dissipation structure.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A heat dissipation structure comprising:
    a heat dissipating unit which comprises a plurality of extending parts which extends in a first direction, the heat dissipating unit configured to be thermally connected to an apparatus configured to produce heat; and
    a heat accumulating unit comprising a heat storage material and an accommodating unit configured to be thermally connected to the extending parts, the accommodating unit accommodating the heat storage material in a sealed manner, wherein
    the extending parts are arranged with gaps in a second direction intersecting with the first direction,
    the accommodating unit comprises a plurality of sealing portions and a plurality of intermediate portions, the sealing portions are separated from each other, each of the sealing portions accommodating the heat storage material in a sealed manner, the intermediate portions connecting the sealing portions,
    the sealing portions are configured to be disposed in the gaps between the extending parts, respectively, and
    the intermediate portions are supported by the extending parts,
    wherein each of the extending parts comprises a first end in the first direction and a second end on an opposite side of the first end, the second end positioned closer to the apparatus than to the first end,
    wherein a pressing member abuts a first film of the accommodation unit and the first ends abut a second film of the accommodation unit such that the pressing member presses the intermediate portions of the accommodating unit against the first ends.

2. The heat dissipation structure according to claim 1, wherein the heat storage material is configured to absorb heat accompanying phase transition from solid state to liquid state.

3. The heat dissipation structure according to claim 1, wherein the accommodating unit is configured to be deformed by flow of the heat storage material in liquid state.

4. The heat dissipation structure according to claim 1, wherein the length of each of the sealing portions in the second direction is settable to be greater than the length of each of the gaps between the plurality of extending parts in the second direction.

5. The heat dissipation structure according to claim 4, wherein the pressing member is configured to press the heat accumulating unit so that the accommodating unit is pressed against the plurality of extending parts.

6. The heat dissipation structure according to claim 5, wherein the pressing member is configured to press the sealing portions toward inside of the gaps between the plurality of extending parts.

7. The heat dissipation structure according to claim 5, wherein the pressing member is configured to elastically press the heat accumulating unit.

8. The heat dissipation structure according to claim 5 further comprising a housing which accommodates the heat dissipating unit and the heat accumulating unit, wherein
    the housing comprises the pressing member.

9. The heat dissipation structure according to claim 1, wherein each of the extending parts comprises a first area which is configured to be covered by the accommodating unit and a second area which is configured to be exposed.

10. The heat dissipation structure according to claim 1, wherein the accommodating unit is configured to be thermally connected to the extending parts at a position closer to the first ends than to the second ends.

11. The heat dissipation structure according to claim 10, wherein each of the intermediate portions is supported by the respective first ends.

12. The heat dissipation structure according to claim 1, wherein the heat accumulating unit provided with a portion inside the accommodating unit in which the heat storage material in liquid state is flowable.

13. The heat dissipation structure according to claim 1, wherein the accommodating unit comprises a film-like shape.

14. A device comprising:
    the apparatus configured to produce heat; and
    the heat dissipation structure according to claim 1.

* * * * *